United States Patent [19]
Williams et al.

[11] Patent Number: 5,587,711
[45] Date of Patent: Dec. 24, 1996

[54] METHOD AND SYSTEM FOR RECONSTRUCTING QUANTIZED SIGNALS

[75] Inventors: Lance J. Williams, Los Altos; Michael Kass, Aptos, both of Calif.

[73] Assignee: Apple Computer, Inc., Cupertino, Calif.

[21] Appl. No.: 315,637

[22] Filed: Sep. 30, 1994

[51] Int. Cl.⁶ .................................................. H03M 1/66
[52] U.S. Cl. .......................................... 341/144; 341/143
[58] Field of Search ................................ 341/138, 143, 341/144; 364/724.1

[56] References Cited

U.S. PATENT DOCUMENTS

| | | | |
|---|---|---|---|
| 4,782,324 | 11/1988 | Underwood | 341/147 |
| 5,226,000 | 7/1993 | Moses et al. | 364/724.1 |
| 5,313,205 | 5/1994 | Wilson | 341/144 |
| 5,387,910 | 1/1995 | Medan et al. | 341/61 |

OTHER PUBLICATIONS

"Non–Overshooting Hermite Cubic Splines for Keyframe Interpolation", Paul Heckbert, *3-D Technical Memo 10*, pp. 1–8, Feb., 1985.

"Reduction of MSE in R–times Oversampled A/D Conversion from O(1/R) to O(1/R²)", Nguyen T. Thao et al., *IEEE Transactions on Signal Processing*, vol. 42, No. 1, pp. 200–203, Jan., 1994.

"Optimal MSE Signal Reconstruction in Oversampled A/D Conversion Using Convexity", Nguyen T. Thao et al., *IEEE,* pp. IV165–168, Sep., 1992.

"Oversampled A/D Conversion Using Alternate Projections", Nguyen T. Thao et al., Proceedings of the 25th Annual Conference on Information Sciences and Systems, Dept. of Electrical and Computer Engineering, John Hopkins Univ., pp. 241–248, no date given.

"Lower Bound on the Mean Squared Error in Oversampled Quantization of Periodic Signals", Nguyen T. Thao et al., Dept. of Electrical Engineering and Center for Telecommunications Research, Columbia Univ., New York, NY, pp. 1–39, Jun., 1993.

*Primary Examiner*—Marc S. Hoff
*Attorney, Agent, or Firm*—Burns, Doane, Swecker & Mathis, L.L.P.

[57] ABSTRACT

A method and system for reconstructing quantized signals is described. Non-linear filtering is applied to a quantized signal to distribute quantum changes over their respective time intervals to provide, for example, a smoother reconstructed signal. The quantization bounds are enforced for each refined signal point to ensure a reconstructed signal that is within the bounded uncertainty associated with the original signal. The process can be applied to selected control points of the quantized signal and non-overshooting splines can be used to interpolate therebetween.

17 Claims, 12 Drawing Sheets

METHOD AND SYSTEM FOR RECONSTRUCTING QUANTIZED SIGNALS

BACKGROUND

The present invention relates generally to methods and systems in the field of digital signal processing and, more particularly, to methods and systems for reconstructing quantized signals.

Faithful reproduction is the ultimate goal of digital signal processing systems in which a representation is used to reconstruct an original signal. One example of this type of digital signal processing system is provided by digital audio systems which seek to reconstruct an analog sound signal from a digital representation. The original signal is initially digitized by, for example, sampling and quantizing to reduce the amount of information to be stored as the original signal's representation. Sampling refers to a process wherein measurements of one or more signal parameters are performed at predetermined time intervals. Quantization is the process of expressing some infinitely variable quantity by discrete or stepped values. For example, a step ladder can be said to quantize height. This is illustrated in FIG. 1, wherein the line 10 is constituted by a continuum of height values, whereas the vertical grid 20 only expresses height in jumps or quanta denoted by the hashmarks. To quantize all of the values in line 10 using the quanta defined by the grid 20, each point in the line is assigned a new height value equal to that of the nearest hashmark. Those skilled in the art will appreciate that although this example portrays the quanta as being equidistant, some applications may benefit from quanta which are of different size. Quantizing the line using the grid 20 results in the staircase function 30 shown in FIG. 2.

Clearly, the staircase function 30 and the line 10 are not the same. The difference between points in these functions is attributable to quantizing error. Quantizing error creates a bounded uncertainty region within which it is known that the original signal point lies hereinafter termed the "quantization bounds". This concept is illustrated pictorially by the shaded regions in FIG. 3.

As can be seen by comparing FIGS. 1 and 2, the quantizing error ranges from $+\frac{1}{2}$ A to $-\frac{1}{2}$ A, where A is the size of the quantum. Since the magnitude of the quantizing error A is limited, its effect can be reduced by providing more quantizing intervals, i.e., by reducing A. However, this requires that more information be provided to express each point in the original signal's representation, for example, sixteen bits instead of eight bits. Although many applications justify the additional complexity, and concomitant expense, attributable to greater quantization resolution, other applications do not. Moreover, increasing the quantization resolution merely makes the steps in the reproduced signal smaller but does not change the underlying assumption in conventional reconstruction techniques that each quantized sample represents a distinct value of the signal, rather than a range of values to which the signal is restricted during the time interval represented by the sample.

Returning to the digital audio example, one conventional method for alleviating quantizing error is to provide a low pass filter having a frequency response that prevents images from passing and allows only the baseband signal to emerge. In terms of the earlier described step function, this filter essentially smooths out the corners of the steps in the reconstructed analog signal. These low pass filters are frequently called "brickwall" filters because an ideal frequency response for such filters has a rectangular shape. However, the infinite slope at the cutoff frequency of these filters is, in practice, difficult to implement. On the other hand, more practical circuitry using low pass filters having a frequency response with a finite slope at the cutoff frequency produces unwanted aliasing products in the output signal, or filters out desirable high frequencies.

In order to overcome this problem associated with analog low pass filters, another conversion/reconstruction technique was developed known as "oversampling". Basically, an oversampled signal is one which is sampled at a rate greater than the Nyquist rate. This can be accomplished, for example, by using a digital filter to interpolate original samples to create new samples. By increasing the sampling rate, the slope of the frequency response of the low pass filter can be made more gradual. This in turn reduces the complexity, and therefore cost, of the analog reconstruction filter. Oversampling does not address the issue raised above regarding the limitations of using a staircase function to represent an original signal.

Digital filters, such as FIR filters and IIR filters, which are commonly employed in oversampling circuitry also fail to provide optimal reconstructions. These filters distribute signal energy in a fixed pattern based upon the filter's number and placement of taps, rather than adapting to local characteristics of the signal.

Thus, both of these conventional techniques suffer from the limitations inherent in the usage of a low pass filter to smooth the transition from one quantum to another. Specifically, as mentioned above, the low pass filter only serves to smooth the steps in the staircase function. This smoothed staircase, although within the uncertainty bounds imposed by quantization, is in many cases a statistically unlikely representation of the original signal. Moreover, as more smoothing is applied, the quantization bounds of the original sampled sequence are typically violated, thereby undermining the integrity of the reconstruction.

As can be seen from the foregoing, it would be desirable to provide more flexible alternatives to conventional techniques for signal reconstruction.

SUMMARY

According to the present invention, these and other drawbacks and limitations of conventional signal reconstruction techniques are overcome by optimizing a quantized signal prior to reconstruction such that each quantum amplitude change can be distributed over the time interval in which it occurs, in a manner which reflects the length of that time interval. That is to say that the filter is time-varying. The optimization function by which the quantum change is distributed can be changed to reflect whatever a priori knowledge of the signal is available. In this way, the smoothed staircase representation used to reconstruct signals in conventional techniques is eliminated in favor of a more parsimonious representation. In an iterative optimization method, the quantization bounds can be enforced at each iteration so that the refined signal points do not violate the bounded uncertainty region of the original signal.

According to one exemplary embodiment of the present invention, this parsimonious representation can be created by optimizing the quantized signal such that each quantum change is distributed so that the reconstructed signal is characterized by smooth, low energy segments rather than staircase function segments. When applied to classes of signals that are anticipated to be comprised of smooth segments, this exemplary embodiment will provide a more realistic reconstruction.

According to another exemplary embodiment of the present invention, this optimization can be implemented by selecting a subset of the samples in the signal, for example those at the boundaries of quantum changes, and using interpolation techniques to provide the desired transition therebetween. Since only a portion of the samples are evaluated, processing speed will be increased.

According to yet another exemplary embodiment of the present invention, the inventive reconstruction techniques can be applied to image signal processing to achieve resolution enhancement.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

In order to provide a greater understanding of signal reconstruction according to the present invention, a first exemplary embodiment will be described with respect to oversampling D/A conversion. Those skilled in the art will readily appreciate, however, that the present invention can be applied to any environment in which quantization and subsequent reconstruction occur.

Figure 1:
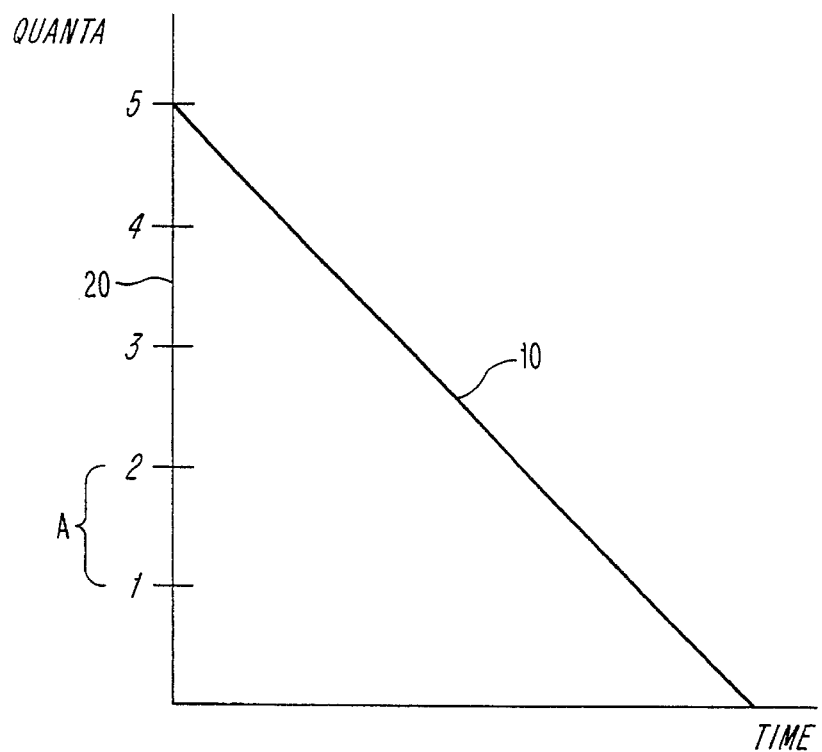
FIG. 1 illustrates a signal to be quantized next to a quantizing grid.
Figure 2:
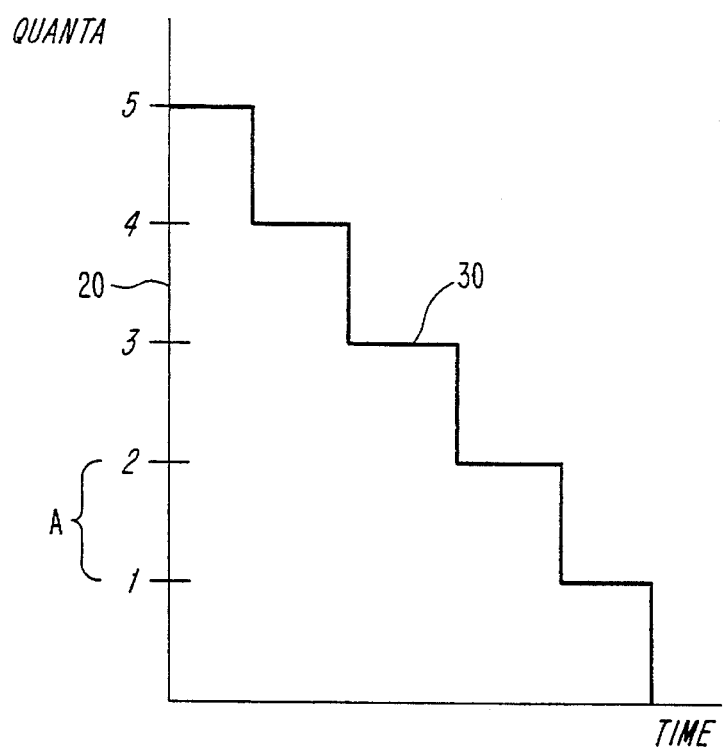
FIG. 2 illustrates the signal of FIG. 1 which has been quantized to produce a staircase function.
Figure 3:
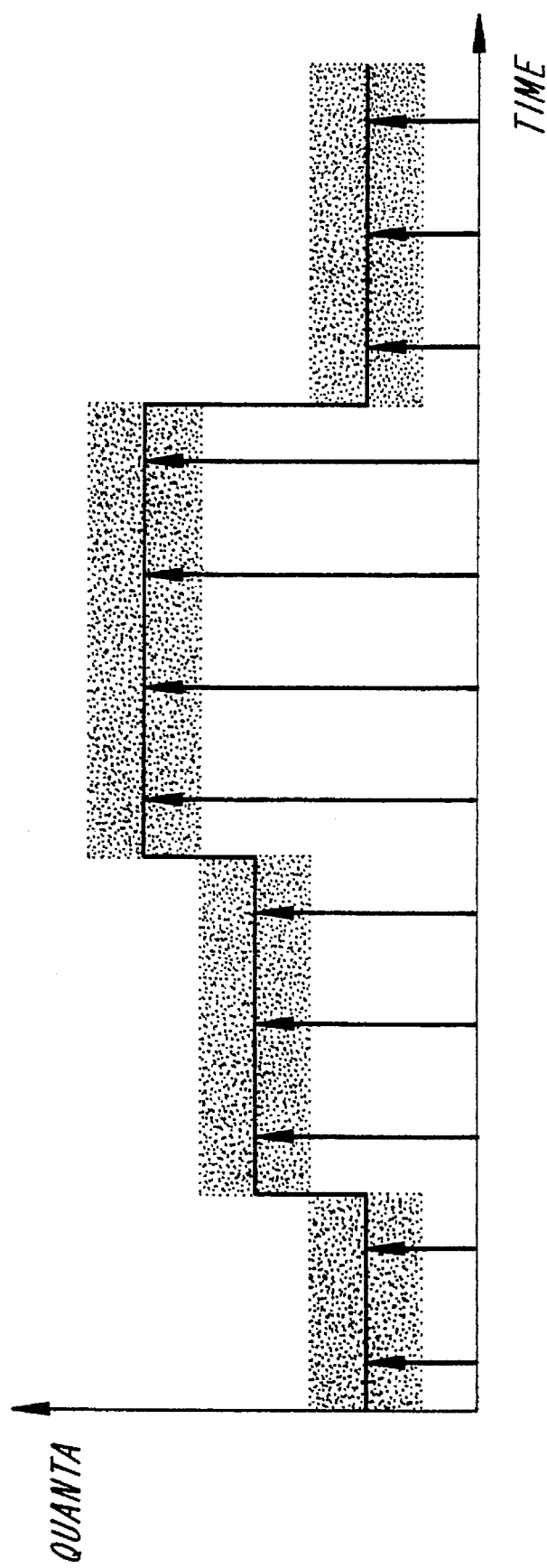
FIG. 3 is a graph which depicts the uncertainty bounds in a quantized signal.
Figure 4:
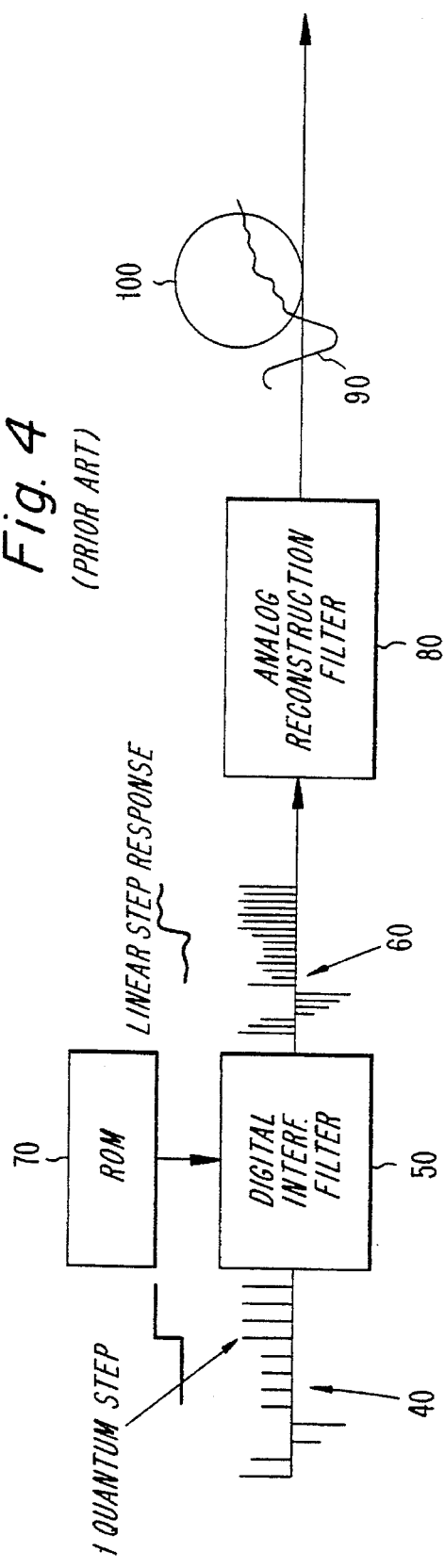
FIG. 4 is a block diagram of a conventional oversampling D/A converter.

In FIG. 4, an input signal 40 is provided to a digital interpolating filter 50. The input signal 40 is a time sampled, coarsely quantized version of an original signal (not shown). Note that the rightmost set of samples in this exemplary input signal section includes a single quantization-level change occurring in an eight sample span (four successive samples at the same quantization value, followed by four successive samples at the next higher quantization level). The digital interpolating filter 50 upsamples the signal 40 to provide an output 60 which, as illustrated, includes additional samples provided at instants between those found in the input signal 40. This digital interpolating filter can also be used to output samples having increased amplitude resolution, for example, the input signal 40 could provide 16 bits of amplitude information while the output of the digital filter could provide 20 or 22 bits of amplitude information.

The quantization-level change in the input signal 40 appears in the output signal 60 as a somewhat smoothed, linear step response. This is a characteristic of any linear filter reconstruction: a quantum change in an extended sequence will be reconstructed as a distinct "bump" of some shape, depending on the exact characteristics of the filter. In the nonlinear reconstruction of the present invention described below, such quantum changes are distributed over the signal in such a way that they no longer appear as distinct features.

While there are many types of digital filters which can be used to achieve this result, one example is a finite impulse response (FIR) filter which can perform this task using phase coefficients that are calculated to appropriately weight contributions from a predetermined number of adjacent samples to arrive at a value for each new sample. These phase coefficients can, for example, be stored in ROM 70 for use by the digital filter 50. The implementation details of digital interpolating filters are well known in the art and, accordingly, are not further described herein. By providing a more densely sampled signal, the performance characteristics of the analog reconstruction filter 80, which is used to provide the continuous output signal 90, can be relaxed. However, the continuous output signal 90 still suffers from the above-described staircase effect as illustrated by the exaggerated, magnified signal portion 100.

Figure 5:
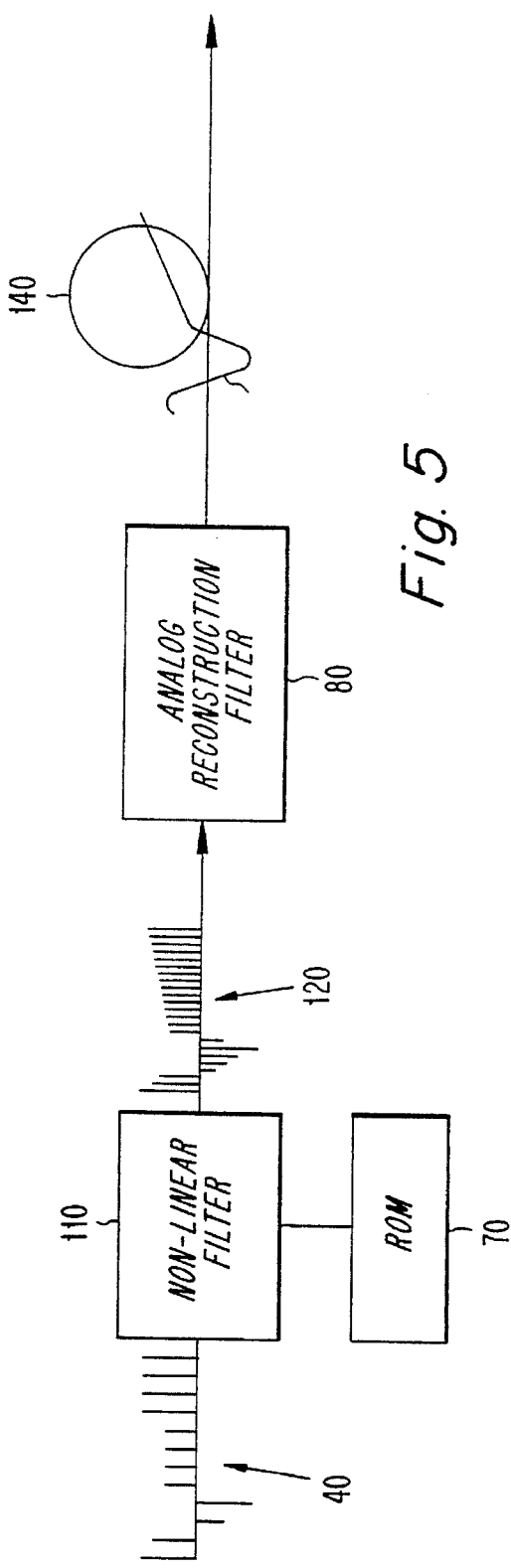
FIG. 5 is a block diagram of an oversampling D/A converter according to the present invention.

Thus, according to an exemplary embodiment of the present invention illustrated in FIG. 5, the staircase effect can be eliminated by modifying the upsampling process to include a desired optimization which distributes the amplitude changes over time, rather than enforcing them in discrete jumps. The particular distribution should be based upon whatever a priori knowledge is available of the particular types of signals being processed, for example, statistical expectations for the class of signals being operated upon. For the purposes of illustration, an optimization will be described wherein a smoothest, or least energetic, distribution of each quantum change is applied, although those skilled in the art will appreciate that other types of distributions are conceivable. It is possible, for example, to minimize an energy measure based on deviation from an expected signal power spectrum. Another important type of distribution is that based on energy measures such as the "weak string" and "weak rod," which breaks continuity in the reconstruction under some conditions, and can better reconstruct sharp discontinuities or transients in the original signal.

This optimization can be performed by providing a nonlinear digital filter 110 which transforms the quantized input signal 40 into a dequantized signal 120 by refining the amplitude values found in the quantized signal. Thus the dequantized signal 120 will be expressed using more bits than the quantized input signal 40. Note that the illustration of the non-linear filter 110 as a single block in FIG. 5 which incorporates the upsampling function is generalized to indicate that upsampling can occur before or after the nonlinear dequantization process. If upsampling occurs prior to dequantization, then the samples and their respective quantization bounds are integer replicated prior to being subject to the non-linear filtering process. An integer case of one is included to indicate that the present invention is also applicable where no upsampling is provided.

At the same time, the quantization or uncertainty boundaries implied by the size of the quanta used to characterize the quantized input signal 40 will be imposed on the refined amplitude values so that they are at least statistically possible reproductions of the original signal points. For the particular smoothing operators described below with respect to one-dimensional and two-dimensional optimizations, cubic polynomials can be employed to represent signal segments. To generalize further, however, an exemplary filtering iteration which can be performed by non-linear filter 110 will now be described with respect to the flow charts of FIGS. 6(*a*) and 6(*b*).

The signal sequence is loaded into memory (not shown) at block 200 and the quantization bounds are initialized at 210 by storing the upper and lower bounds for each sample in the input sequence. A sequence iteration begins at block 220 with a sample indexing loop commencing at block 225 with a first point being filtered based on the desired optimization, for example using a smoothing operator. The sample is then replaced either with the output of the filtering process of 230 or, if the output of the filtering process violates an upper or lower boundary associated with that sample which is checked at block 240, with the value of the violated boundary. If other samples have yet to be processed at block 244, then the sample index is incremented at 246 and the modification process repeats. When the last sample has been processed at block 244, it is determined whether or not the signal sequence has been modified sufficiently at block 250. If so, then the process is complete and the modified signal sequence 120 of FIG. 5 is then output. Otherwise, another iteration begins and the process flow returns to block 220.

Figure 6A:
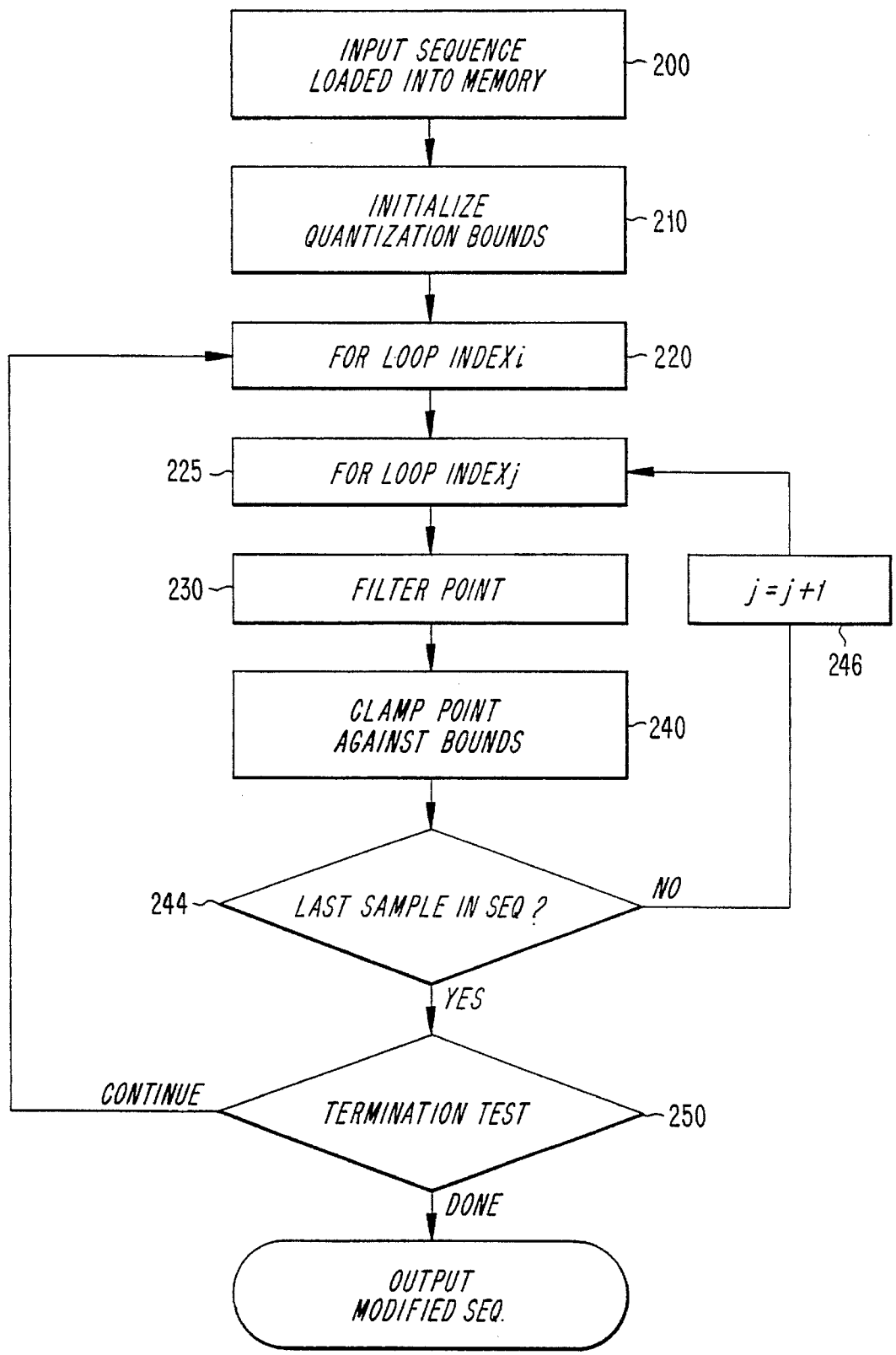
FIGS. 6(a) and 6(b) are flowcharts illustrating iterative filtering according to an exemplary embodiment of the present invention.
Figure 6B:
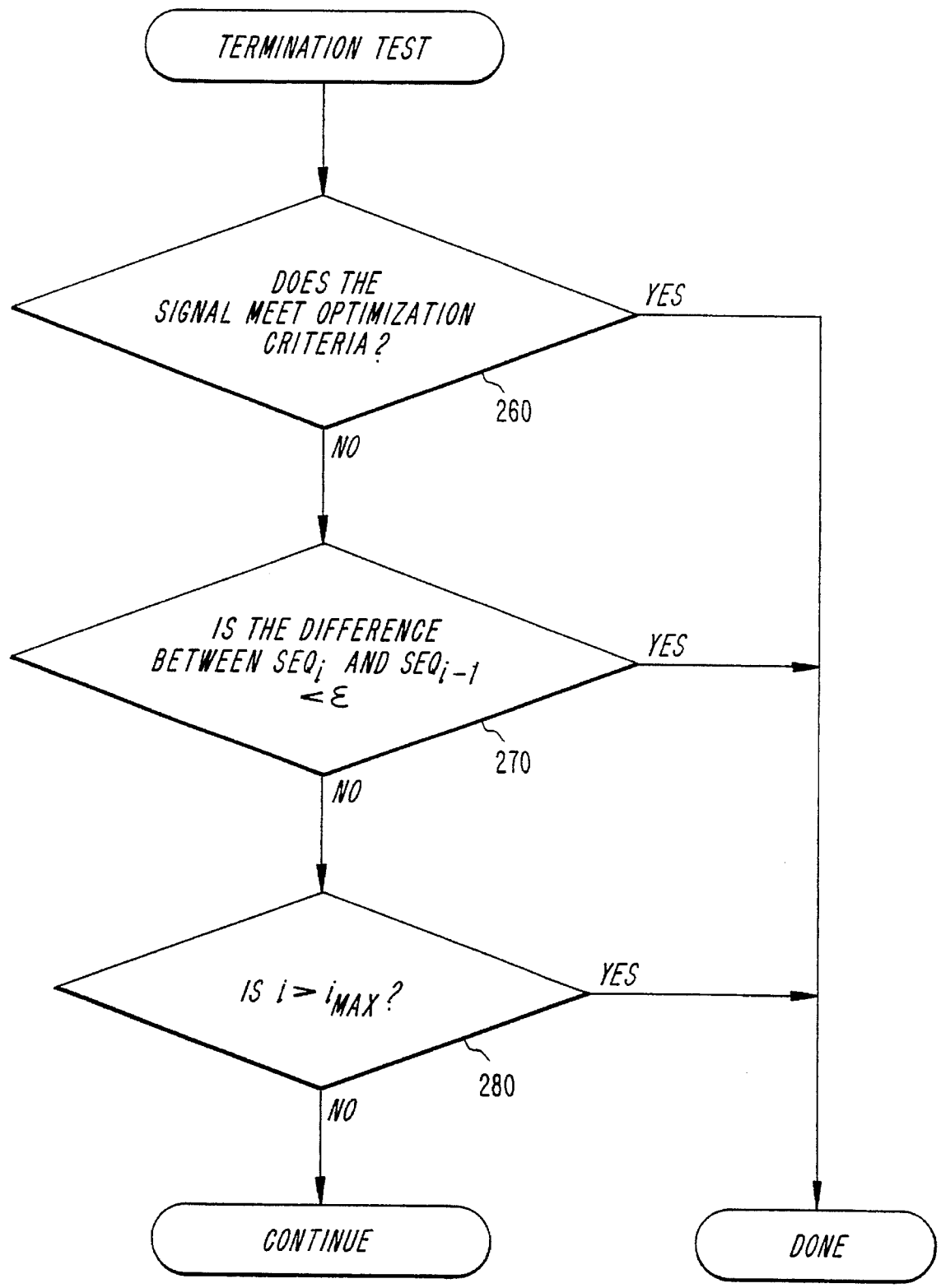

An exemplary termination test for block 250 will now be described with respect to FIG. 6(*b*). If the signal sequence which has been processed now meets the optimization criteria at block 260, e.g., if the signal is sufficiently smooth, then the process is complete and the flow moves to the "Done" block. Otherwise the flow moves to block 270 where it is determined whether the latest signal sequence differs by no more than a threshold amount, according to some predetermined error norm, from the signal sequence as modified by the last iteration. If so, then the modification is complete and the flow moves to "Done". Otherwise, as a third test, if the number of iterations has exceeded some predetermined threshold, which may be used to limit the processing time and accuracy of the reconstruction, then the process can be terminated by block 280. Of course, those skilled in the art will readily appreciate that the foregoing exemplary termination test could include other tests or only one or more of those tests described with respect to blocks 260 through 280.

Although the exemplary embodiment of FIG. 5 illustrates the application of the optimization function to the input signal as a process which is immediately upstream of the analog reconstruction filter, those skilled in the art will appreciate that a digital linear filter can be provided between these elements to further tailor the spectrum of the signal. This would be of particular value, for example, in using the straight-line dequantization methods shown in FIG. 7(*d*) and FIG. 7(*e*). A subsequent linear digital filter could be used to attenuate the high-frequency artifacts introduced by this interpolation, prior to analog reconstruction of a continuous signal.

As the other similarly numbered components of FIG. 5 perform the same functions described with respect to FIG. 4, such description will not be repeated here. Note, however, that the output signal 130, 140 in FIG. 5 does not have the characteristic steps of the staircase function seen in output signal 90 of FIG. 4 since the non-linear filter 110 has removed the steps from the signal by applying the smoothing optimization function thereto.

The iterative optimization method described above with respect to FIGS. 6(*a*) and 6(*b*) is very general, and applies in a straightforward way to the dequantization of two-dimensional signals, such as images. For the minimization of some energy measures, higher-order elements which represent segments of the signal can permit a more direct solution. In the particular case of minimizing the integral of the second derivative of the solution, cubic polynomials can be used. Such an approach is quite similar to the use of natural cubic splines to interpolate quantized data values for reconstruction. In methods according to the present invention, a system of equations are solved which specify minimization of the integral of the second derivative of the solution, and restriction of the cubic polynomial segments (at the sample points) to the range of the quantization bounds at each sample.

To provide another example of the present invention, which uses cubic polynomial elements without solving such a system of equations, a description will now be provided of an illustrative optimization function which employs non-overshooting splines and its application to a quantized signal with reference to FIGS. 7(*a*)–7(*e*). FIG. 7(*a*) depicts a quantized signal which is represented as successive horizontal (e.g., 72 and 74) and vertical (e.g., 76 and 78) segments in a time/amplitude graph. According to this exemplary embodiment, the processing time needed to arrive at the dequantized signal can be reduced by evaluating the quantized signal based only on a subset of the total sample points. This subset can be selected to include only those signal points which convey the most information regarding the original signal, for example, signal endpoints and endpoints of segments which precede a segment having a length greater than one quantum.

This exemplary control point selection process is illustrated in FIG. 7(*b*). Note therein that some segment endpoints, such as those referenced by numeral 600, are darkened to indicate their status as selected control points. By contrast, segment endpoints such as those denoted by 610 are not darkened since those endpoints precede segments having a length which is less than one quantum's distance.

Figure 7A:
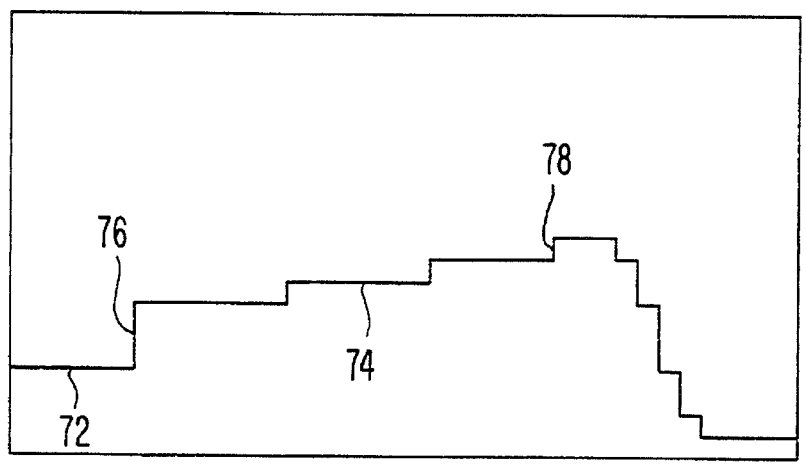
FIGS. 7(a)–7(e) illustrate various exemplary control point selection and interpolation techniques according to the present invention.
Figure 7B:
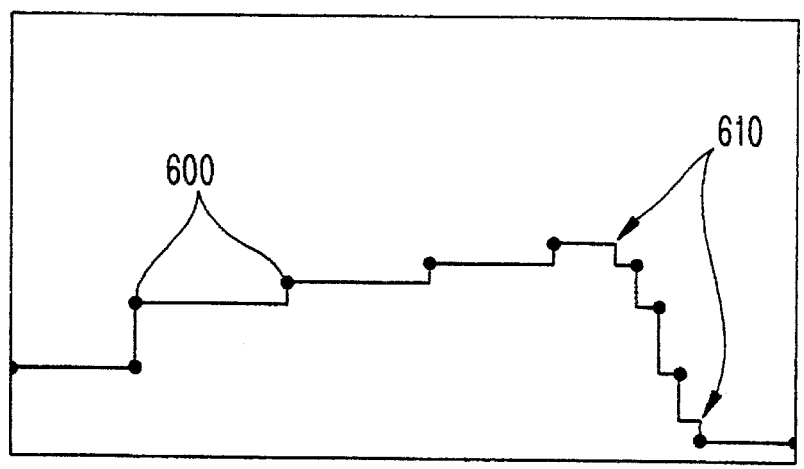
Figure 7C:
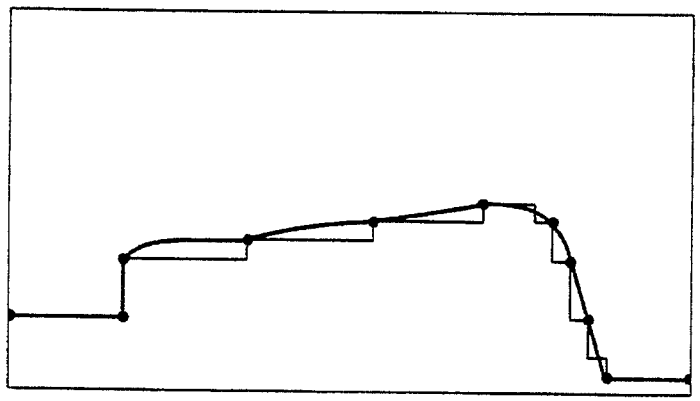
Figure 7D:
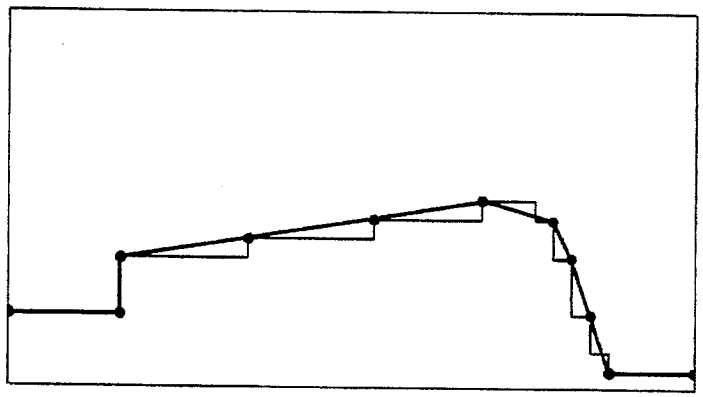

To realize the dequantized signal, some form of interpolation can be used. For example, as illustrated in FIG. 7(*c*), non-overshooting splines can be used to interpolate between the control points previously selected. Although non-overshooting splines are only one of many interpolation techniques which can be used to arrive at a dequantized signal, such splines are an attractive solution since they inherently meet the criterion of falling within the quantization bounds so that the additional step of determining whether or not the quantization bounds have been violated need not be performed. While it is believed that non-overshooting splines have not been applied in this manner previously, the conditions under which a cubic curve can be restricted within amplitude bounds are relatively straightforward to derive and express, and therefore they are not further discussed herein. The interested reader is referred to an article entitled "Non-Overshooting Hermite Cubic Splines for Keyframe Interpolation" by Paul Heckbert for a general discussion of non-overshooting splines, which disclosure is incorporated here by reference. As a specific case of non-overshooting splines, linear interpolation could also be used to arrive at the dequantized signal. This example is illustrated in FIG. 7(d).

Figure 7E:
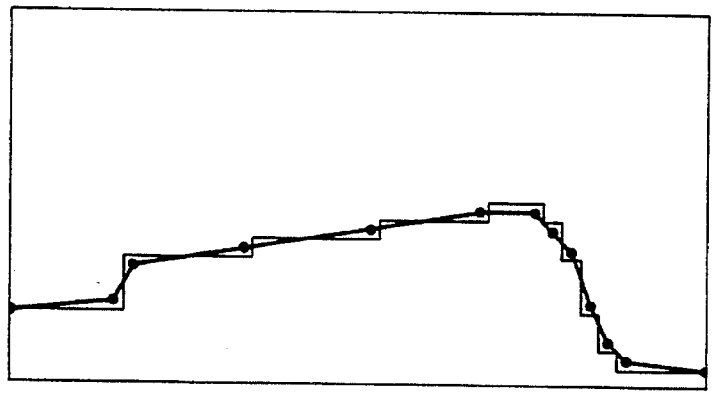

According to yet another exemplary embodiment of the present invention depicted in FIG. 7(e), control points can be selected using a grid cell depiction of the quantized signal. The phrase "grid cell" is used herein to mean a one quantum square block, a plurality of which are illustrated as being overlaid on the signals shown in FIG. 7(e). Control points are selected here to be (1) the signal endpoints and (2) centers of grid cells at inside corners of successive quantum changes in direction. Although not implicated by the quantized signal of FIG. 7(e), if only a one quantum change separates successive quantum changes in direction, this would result in only one control point being placed at the center of the grid cell defined by the first horizontal segment of the pair. These control points can then be connected using, for example, linear or, as illustrated, spline interpolation.

While the foregoing description is couched in terms of signals in general, with specific reference being made to audio signals, those skilled in the art will understand that the concepts and techniques for dequantization described herein are also applicable to other fields of endeavor. For example, the present invention is also envisioned to allow improved dequantization in image reproduction which can be translated into improved resolution. This inventive technique makes use of the dequantization of both intensities and edges.

As an aid to understanding intensity dequantization, consider a photograph of someone standing in front of a fence with grass and flowers at their feet and a bright blue sky in the background. This picture is then digitized, e.g., by scanning, and quantized to some relatively small number of bits, e.g., four bits. Thus, sixteen gray levels are available to describe the image captured by the photograph.

Comparing the original photograph with the quantized reproduction in a sixteen level gray scale, one would find quantized objects such as the person, the fence, the grass and the flowers to be visually similar to their original counterparts due to the number of quantization changes used to represent those objects. However, the blue sky is relatively uniform in intensity and, therefore, has relatively fewer quantization changes. This translates into a gray scale representation which looks much like a contour map having lines or edges which represent quantum changes. In the original, on the other hand, these changes are gradual so that the expression of the sky background in the quantized image stands out as being markedly different from the background in the original image. Thus, in this example, the quantization has produced artifacts which are undesirable in the sense that they are visually disturbing.

Now consider applying the aforedescribed, nonlinear dequantization technique to the quantized picture such that the quantum level changes are distributed evenly over each interval, but the pixel values are required to stay within the quantization bounds. As with the earlier embodiment, the amplitude resolution of the dequantized image will be increased. For example, the four bit gray scale representation could be increased to eight bits, providing sixteen levels with which to describe points within each quantum of the original quantized picture. To describe this process in more graphical terms, as the smoothing effect of the nonlinear dequantization process occurred through each iteration, one would notice some smoothing in the foreground but a much more marked improvement in the sky background.

Figure 8:
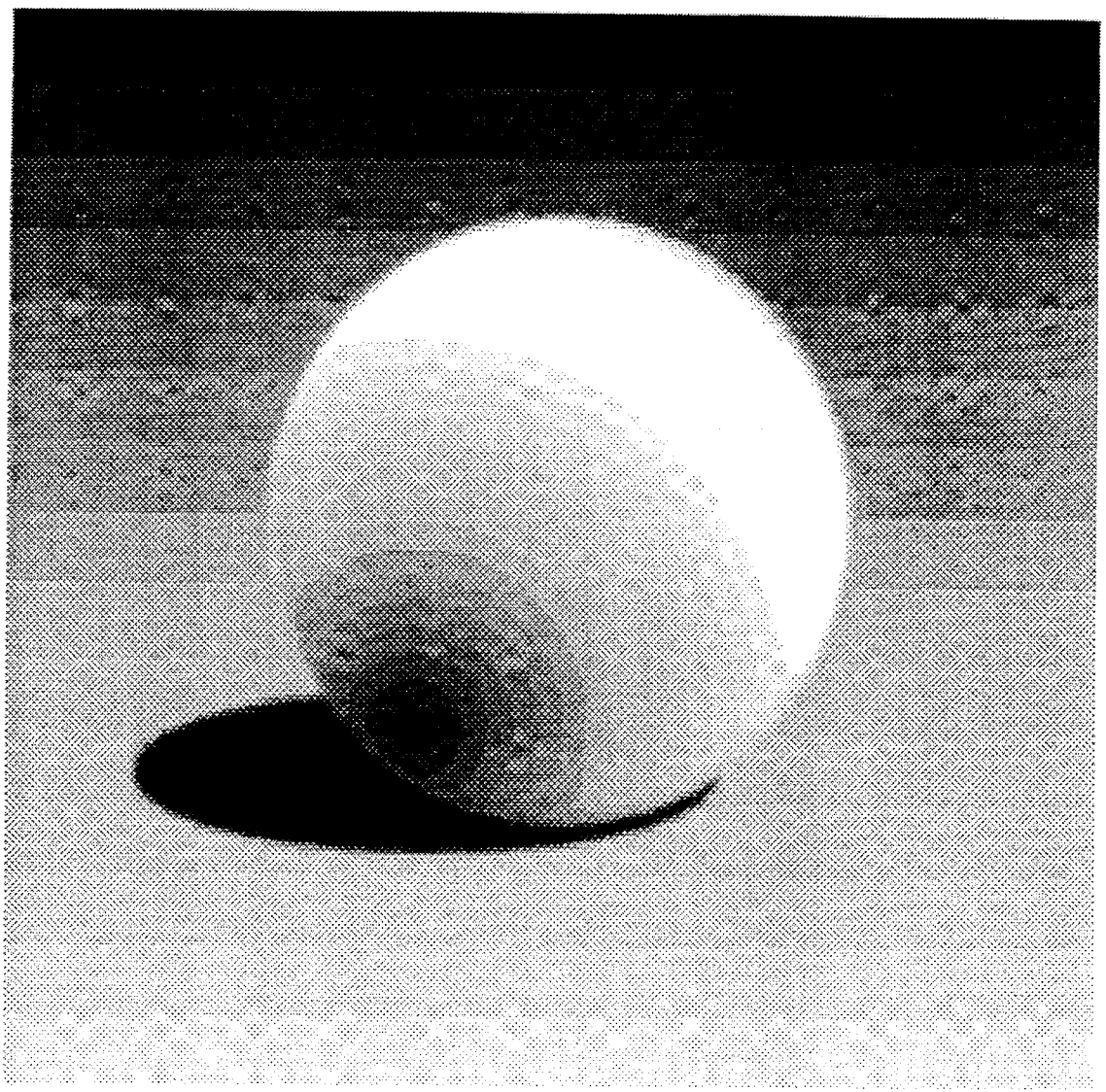
FIG. 8 illustrates a quantized sphere image.
Figure 9:
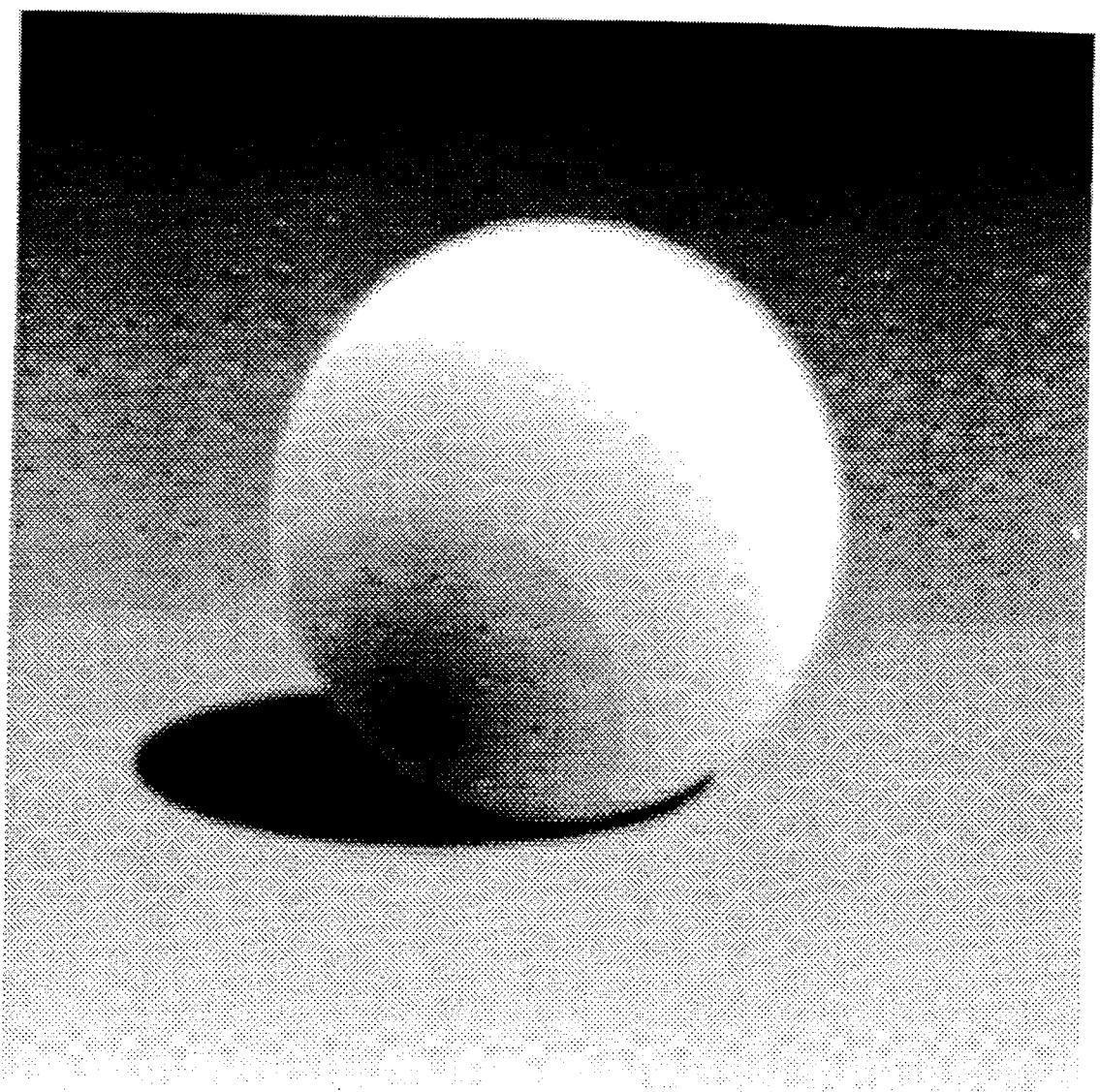
FIG. 9 shows the sphere of FIG. 8 after having been dequantized according to the present invention.

This dequantization of intensity is illustrated in FIGS. 8 and 9. FIG. 8 shows a four bit sphere image which is quantized into sixteen levels of intensity. FIG. 9, on the other hand, illustrates the same four bit sphere image which has been dequantized according to the present invention. A scattered data interpolant based on a minimization of the integral of the second derivative (known as a thin-plate spline) is used as the optimization function for the filtering process. For this example, the two-dimensional smoothing operator coefficients which were used to perform the illustrated dequantization are set forth below.

| 0. | 0. | −1. | 0. | 0. |
| 0. | −2. | 8. | −2. | 0. |
| −1. | 8. | 0. | 8. | −1. |
| 0. | −2. | 8. | −2. | 0. |
| 0. | 0. | −1. | 0. | 0. (all terms divided by 20.0) |

These coefficients can be provided, for example, to the ROM 70 in FIG. 5.

Figure 10A:
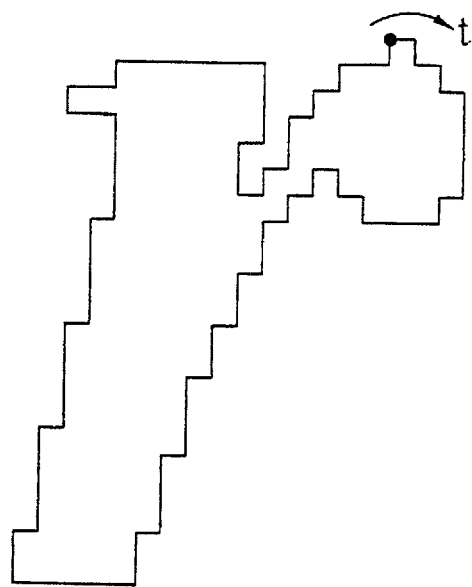
FIG. 10(a) illustrates a quantized letter "r"
Figure 10D:
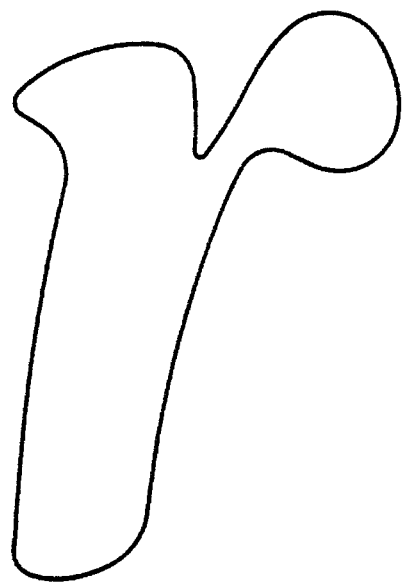
FIG. 10(d) shows a dequantized version of the letter "r" illustrated in FIG. 10(a)
Figure 10C:
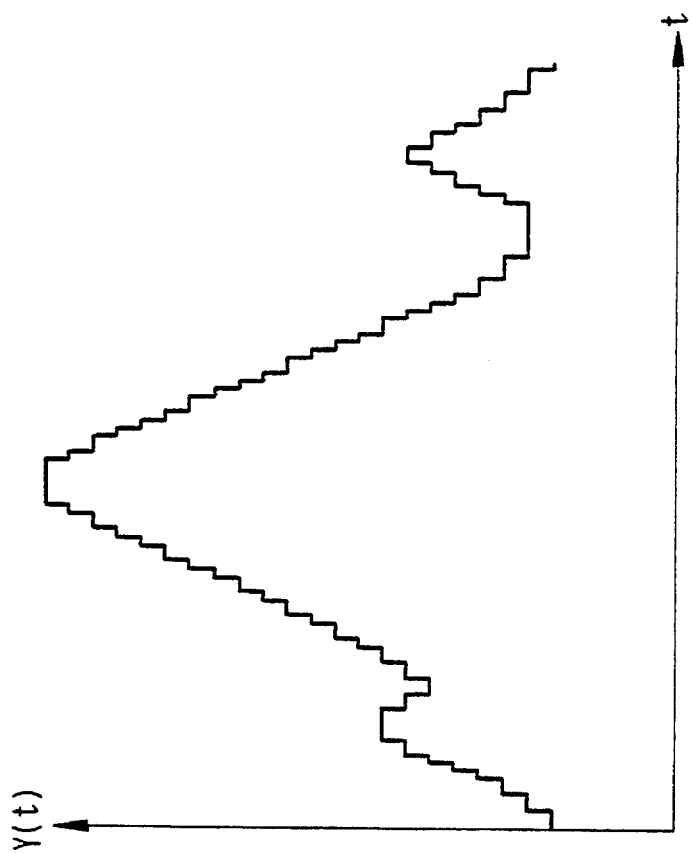
FIGS. 10(b) and 10(c) are graphs illustrating two one-dimensional signal representations of the outline of FIG. 10(a)
Figure 10B:
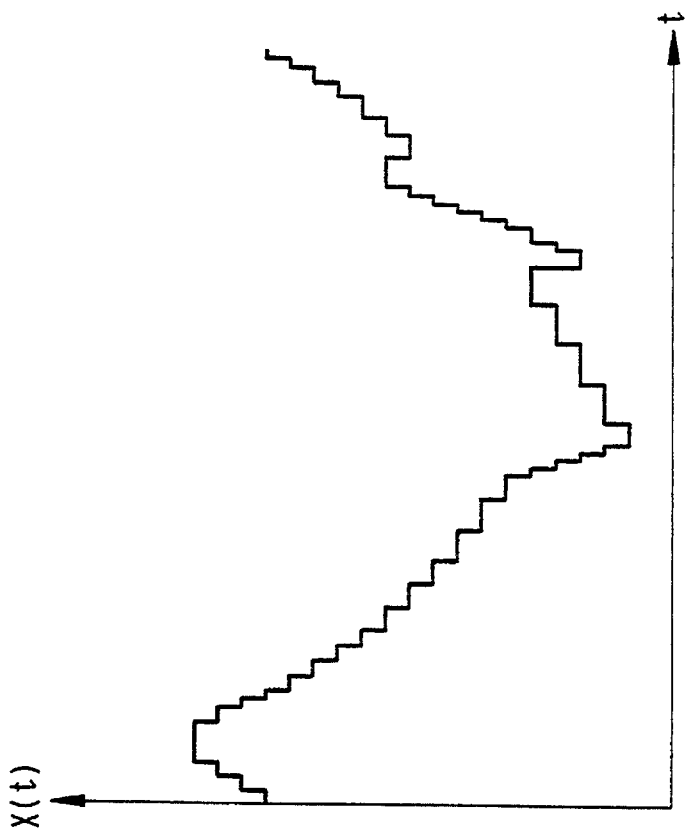
Figure 10E:
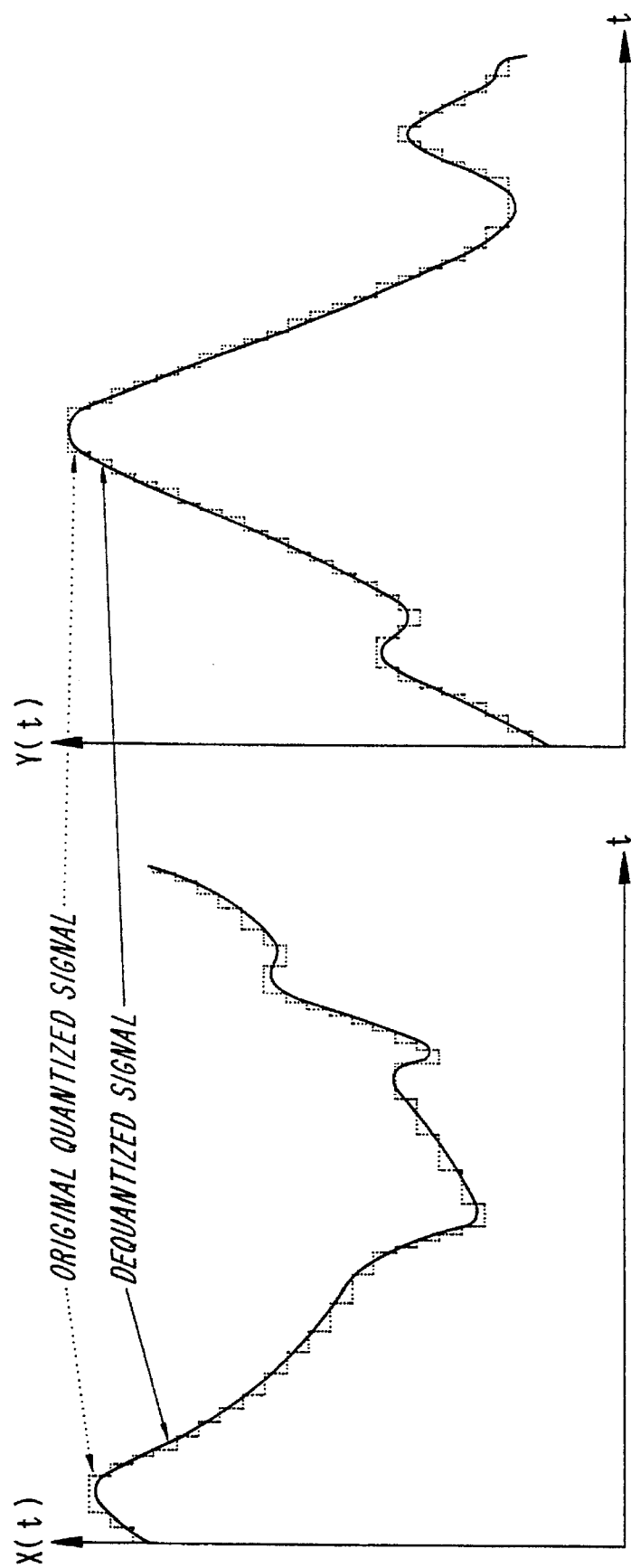
FIG. 10(e) depicts the signals of FIGS. 10(b) and 10(c) with overlaid dequantized signals.

Edge dequantization will be illustrated with the use of FIGS. 10(a)–10(e). For the purposes of this example, suppose that one wishes to dequantize the letter "r" shown in FIG. 10(a). Beginning at the darkened point illustrated in FIG. 10(a), and moving in the direction illustrated by the arrow t, one can express the quantum changes in the outline or contour of the letter "r" as two one-dimensional signals, X(t) and Y(t) as illustrated in FIG. 10(b) and 10(c), respectively. Each of these signals is then dequantized independently in the manner described above. That is, in one dimension an optimization based on, for example, minimizing the integral of the second derivative can be applied as the optimization function. In the example illustrated in FIGS. 10(d) and 10(e) which illustrate a dequantized "r" and the dequantized one-dimensional signals, respectively, the coefficients of an exemplary one-dimensional smoothing operator which was used to perform the dequantization are set forth below.

−1. 4. 0. 4. −1. (all terms divided by 6.0)

In this way a smooth contour is produced.

By combining edge dequantization and intensity dequantization, improved pixel resolution can be achieved. For example, by applying the contour smoothing described above with respect to the outline of the letter "r" in FIG. 10(a) to the contours of the quantized sphere illustrated in FIG. 8, the number of samples in each contour can be increased. Application of the dequantization process to the image boundaries effectively re-estimates the shape of those boundaries, which were formerly composed strictly of horizontal and vertical segments. Then, by scan converting the smooth contours into a new image of arbitrarily high resolution, the new pixel samples inherit the quantization bounds of the original contours. As will be appreciated by those skilled in the art, scan converting is a process whereby surface primitives, for example those stored in a database, are converted into scan lines. Lastly, by applying the intensity dequantization described above to the resampled high resolution image, many of the contours will become invisible, as they did in the dequantized sphere illustrated in FIG. 9. In this way, a higher resolution image can be achieved without providing more information in the original image signal. Although the foregoing exemplary embodiments have been described in terms of image processing wherein plural boundaries are dequantized, those skilled in the art will appreciate that only one boundary, a portion of one boundary or partial boundaries may be dequantized depending upon, for example, the contrast levels in the image.

In the foregoing discussion, dequantization has been described as a method of reconstructing a signal with greater amplitude resolution than that with which it was originally represented. This does not mean that the process can be profitably applied only when the number of digits with which samples are represented is increased (e.g., going from 4-bit numbers to 16-bit numbers). There are many cases where it may desirable to scale a signal up, that is, multiply the samples by a number greater than one. Whenever a signal or portion of a signal is normalized, companded, or amplified, such scaling modifies the range spanned by the sample values. When the range is increased, dequantization can be used prior to scaling to increase the effective amplitude resolution of the signal. A practical example from the digital audio field should clarify this observation.

After mixing and editing a digital soundtrack, the final step before the track is used to master a CD recording is to scale the samples to the full range of representable sample values. Typically, this is done by scanning the entire track for maximum and minimum values, keeping track of the sample value furthest from zero. Then, all samples are scaled by a factor equal to the maximum representable value divided by the absolute value of the sample furthest from zero. This amplifies the signal to the representable range of numbers without bias, that is, without moving the zero point. Consider the case of an original soundtrack which initially spans only a small portion of the range of representable signal values, say −1000 to +1000 in an integer range of +−32,000. The original signal only has 2001 possible distinct sample values, and if it is scaled to the full range of representable numbers as described, it will still only have a maximum of 2001 distinct numerical values. If, on the other hand, the quantization bounds of the original signal are scaled along with the original sample values, and the scaled signal is dequantized using the scaled quantization bounds according to exemplary embodiments of the present invention, a higher-resolution result is possible. Now the distinct numerical values the dequantized samples may assume is limited by the range of representable signal values, rather than the range of the quantized values to which the signal was restricted before scaling.

According to exemplary embodiments of the present invention, the dequantization process described above can be applied without compromise to a signal which is completely specified from beginning to end. This is the case, for example, when processing an audio soundtrack prior to mastering a CD. In many other circumstances, the signal must be processed "on the fly," with some delay, but without waiting until the end of the signal is received before the processing commences. This is the case, for example, in processing an audio signal from a digital radio source. In such circumstances, it is desirably to apply the dequantization to incoming sections of the signal, just as if each section constituted a whole signal, and then to blend successive sections together as each is processed, and output the processed signal continuously.

In conventional practice, signals are often segmented for filtering in this way. The signal is divided into overlapping segments; a certain number of samples at each end of a section is duplicated in the adjoining section. The width of the overlap between sections is based on the effective width of the filter to be applied. As each section of the signal is processed, it is combined (with the proper overlap) with the previous section. The filtered output of these blended sections is valid up to the portion of the processed section which overlaps the next section to be processed.

This conventional means of filtering a signal by segments can also be applied to dequantization. In dequantization, the overlapping signal sections can be extracted from the input signal using a box (Fourier) window. These sections may be determined adaptively, for example, by segmenting at quantum changes rather than being of fixed, predetermined width. In blending the processed sections, it is appropriate to use a smooth window function which goes from 1 (one) to the last non-overlapping sample of the last-processed section to 0 (zero) at the first non-overlapping sample of the currently processed section. This window function can be used to weight a linear blend between the successive sections. The compromise to the dequantizer is that the length of the processed section sets an upper bound on the interval over which quantum changes in the signal can be distributed.

The above-described exemplary embodiments are intended to be illustrative in all respects, rather than restrictive, of the present invention. As mentioned earlier, the present invention can also be applied to distributions other than those which result in a smoothest, or least energetic, reconstructed signal. For example, one can generalize the minimization of the integral of second derivative undertaken in the foregoing examples, to the minimization of "weak string" or "weak rod" energy defined by Blake and Zisserman (Blake, A., and Zisserman, A., *Visual Reconstruction.* MIT Press, Cambridge, Mass., 1987.) In these energy measures, minimization may occur by "breaking" continuity at points of high curvature or strain energy. Such a definition of the energy to be minimized would have practical advantages in the foregoing exemplary embodiments. For example, the corners and cusps would be restored to the contour of the reconstructed "r," and the "halo" artifacts around the boundary of the sphere in FIG. 9 can be diminished or eliminated. Similar energy definitions may also improve transient response in the reconstruction of digital audio signals.

Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A method for reconstructing an original signal from a quantized signal comprising the steps of:

sampling said quantized signal at control points wherein said step of sampling further comprises the steps of:
   identifying horizontal and vertical segments by their respective endpoints in said quantized signal; and
   selecting as control points signal endpoints and segment endpoints preceding a segment which is longer than a quantum in one of time and amplitude;

interpolating said control points to transform said quantized signal into a dequantized signal; and reconstructing said original signal from said dequantized signal.

2. The method of claim 1, wherein said step of interpolating further comprises the step of:

imposing quantization bounds associated with said quantized signal on values resulting from said interpolated control points.

3. The method of claim 1, further comprising the step of:

solving for amplitude values at said selected control points a system of equations constraining cubic polynomial segments to the range of their quantization bounds and minimizing the integral of the second derivative of the solution.

4. An oversampling D/A converter comprising:

means for upsampling a quantized input signal by integer replication of input samples and their quantization bounds;

means for dequantizing a quantized input signal by applying non-overshooting splines as an optimizing function to interpolate points of said quantized input signal; and means for filtering said upsampled, dequantized signal to produce an analog output signal.

5. The oversampling D/A converter of claim 4, wherein said means for dequantizing further comprises a non-linear digital filter which applies said optimizing function to said quantized input signal.

6. The oversampling D/A converter of claim 5, wherein said non-linear digital filter interpolates control points of said quantized input signal to produce a smooth, dequantized signal.

7. The oversampling D/A converter of claim 4, further comprising:

means for imposing quantization bounds of said quantized signal to values resulting from the application of said optimizing function.

8. The oversampling D/A converter of claim 4, wherein said means for dequantizing further comprises:

means for selecting as said points control points which include endpoints of said quantized signal and endpoints of segments of said quantized signal that precede segments which are longer than a quantum.

9. The oversampling D/A converter of claim 4, wherein said means for dequantizing further comprises:

means for selecting as said points control points by tracing a grid cell depiction of said quantized signal, and selecting as said control points endpoints of said quantized signal and centers of grid cells at inside corners of successive quantum changes in direction.

10. A method for increasing a first resolution of an image comprising the steps of:

defining said image as a plurality of regions of constant intensity which are separated by quantized boundaries;

dequantizing at least one of said quantized boundaries to generate dequantized boundaries wherein said step of dequantizing further comprises:

distributing each quantum change of said at least one of said quantized boundaries over its respective spatial interval according to a time-varying optimization function to transform said at least one of said quantized boundaries into a dequantized boundary; and scan converting said at least one of said dequantized boundaries to create a converted version of said image at a second resolution greater than said first resolution.

11. A method for reconstructing an original signal from a quantized signal comprising the steps of:

sampling said quantized signal at control points;

interpolating said control points using non-overshooting splines to transform said quantized signal into a dequantized signal; and reconstructing said original signal from said dequantized signal.

12. The method of claim 11, wherein said step of interpolating further comprises the step of:

imposing quantization bounds associated with said quantized signal on values resulting from said interpolated control points.

13. A method for reconstructing an original signal from a quantized signal comprising the steps of:

sampling said quantized signal at control points wherein said step of sampling further comprises the steps of:

tracing a grid cell depiction of said quantized signal; and selecting as said control points endpoints of said quantized signal and centers of grid cells at inside corners of successive quantum changes in direction;

interpolating said control points to transform said quantized signal into a dequantized signal; and reconstructing said original signal from said dequantized signal.

14. The method of claim 13, further comprising the step of:

solving for amplitude values at said selected control points a system of equations constraining cubic polynomial segments to the range of their quantization bounds and minimizing the integral of the second derivative of the solution.

15. The method of claim 13, wherein said step of interpolating further comprises the step of:

imposing quantization bounds associated with said quantized signal on values resulting from said interpolated control points.

16. The method of claim 13, wherein said step of interpolating further comprises the step of:

performing interpolation using non-overshooting splines.

17. A method for reconstructing an original signal from a quantized signal comprising the steps of:

sampling said quantized signal at control points wherein said step of sampling further comprises the steps of:

identifying horizontal segments of said quantized signal within which a quantization level does not change;

selecting as control points endpoints of each segment and two interior points of each segment which are evenly spaced from one another and from said endpoints; and solving for amplitude values at said selected control points a system of equations constraining cubic polynomial segments to the range of their quantization bounds and minimizing the integral of the second derivative of the solution;

interpolating said control points to transform said quantized signal into a dequantized signal; and reconstructing said original signal from said dequantized signal.

* * * * *